US006455229B1

(12) United States Patent
Vermeersch et al.

(10) Patent No.: US 6,455,229 B1
(45) **Date of Patent: *Sep. 24, 2002**

(54) METHOD FOR MAKING POSITIVE WORKING PRINTING PLATES

(75) Inventors: Joan Vermeersch, Deinze; Marc Van Damme, Heverlee; Guido Hauquier, Nijlen; Eric Verschueren, Merksplas, all of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 09/476,108

(22) Filed: Jan. 3, 2000

Related U.S. Application Data

(60) Provisional application No. 60/127,154, filed on Mar. 31, 1999.

(30) Foreign Application Priority Data

Feb. 2, 1999 (EP) ........................................... 99200292

(51) Int. Cl.[7] ............................................... G03F 7/004

(52) U.S. Cl. .................... 430/302; 101/465; 430/270.1; 430/278.1; 430/348; 430/944; 430/945; 430/964

(58) Field of Search ........................... 430/270.1, 278.1, 430/302, 424, 944, 348, 964; 101/454, 463.1, 465

(56) References Cited

U.S. PATENT DOCUMENTS

| | | | | | |
|---|---|---|---|---|---|
| 4,601,974 | A | * | 7/1986 | Kita et al. | 430/309 |
| 4,840,875 | A | * | 6/1989 | Kunichika et al. | 430/309 |
| 5,143,546 | A | * | 9/1992 | Yuasa et al. | 106/20 |
| 5,378,584 | A | * | 1/1995 | Frass et al. | 430/165 |
| 5,858,604 | A | * | 1/1999 | Takeda et al. | 430/162 |
| 6,152,036 | A | * | 11/2000 | Verschueren et al. | 101/457 |
| 6,174,646 | B1 | * | 1/2001 | Hirai et al. | 430/302 |
| 6,192,799 | B1 | * | 2/2001 | Damme et al. | 101/457 |
| 6,210,856 | B1 | * | 4/2001 | Lin et al. | 430/270.1 |
| 6,276,273 | B1 | * | 8/2001 | Aurenty et al. | 101/457 |

FOREIGN PATENT DOCUMENTS

| | | | | |
|---|---|---|---|---|
| EP | 0 416 861 | A1 | | 3/1991 |
| EP | 0 864 420 | A1 | | 9/1998 |
| EP | 1025992 | A1 | * | 8/2000 |

OTHER PUBLICATIONS

Patent Abstracts of Japan, vol. 013, No. 237 (M–833), Jun. 5, 1989 and JP 01 049687 A (Koyo Kagaku KK), Feb. 27, 1989.

Patent Abstracts of Japan, vol. 014, No. 199 (P–1040), Apr. 23, 1990 and JP 02 040659 A (Fuji Photo Film Co. Ltd.), Feb. 9, 1990.

Patent Abstracts of Japan, vol. 097, No. 010, Oct. 31, 1997, and JP 09 146268 A (Konica Corp.; Mitsubishi Chem. Corp), Jun. 6, 1997.

* cited by examiner

*Primary Examiner*—Janet Baxter
*Assistant Examiner*—Barbara Gilmore
(74) *Attorney, Agent, or Firm*—Breiner & Breiner, L.L.C.

(57) ABSTRACT

According to the present invention there is provided a method for the preparation of a lithographic printing plate comprising the steps of exposing with IR light an imaging element comprising on a lithographic base with a hydrophilic surface a first layer including a polymer, soluble in an aqueous alkaline solution and a top layer on the same side of the lithographic base as the first layer which top layer is IR-sensitive and unpenetratable for or insoluble in an alkaline developer wherein said first layer and said top layer may be one and the same layer, said imaging element comprising a siloxane surfactant;

developing said exposed imaging element with an alkaline solution;

gumming said developed imaging element with a baking gum solution;

subjecting said gummed imaging element to a thermal treatment at a temperature above 50° C.;

characterized in that said baking gum solution contains at least one surfactant making the contact angle between the baking gum solution and the surface of the plate less than 68° and/or at least one viscosity-regulating polymer making the viscosity of the baking gum solution between 1.7 cP and 5.0 cP.

8 Claims, No Drawings

METHOD FOR MAKING POSITIVE WORKING PRINTING PLATES

This application claims the benefit of U.S. Provisional Application No. 60/127,154 filed Mar. 31, 1999.

FIELD OF THE INVENTION

The present invention relates to a method for preparing a lithographic printing plate. More specifically the invention is related to a method for preparing a lithographic printing plate with improved printing properties.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

Alternatively, printing plates are known that include a photosensitive coating that upon image-wise exposure is rendered soluble at the exposed areas. Subsequent development then removes the exposed areas. A typical example of such photosensitive coating is a quinone-diazide based coating.

Typically, the above described photographic materials from which the printing plates are made are camera-exposed through a photographic film that contains the image that is to be reproduced in a lithographic printing process. Such method of working is cumbersome and labor intensive. However, on the other hand, the printing plates thus obtained are of superior lithographic quality.

Attempts have thus been made to eliminate the need for a photographic film in the above process and in particular to obtain a printing plate directly from computer data representing the image to be reproduced. However the photosensitive coating is not sensitive enough to be directly exposed with a laser. Therefor it has been proposed to coat a silver halide layer on top of the photosensitive coating. The silver halide may then directly be exposed by means of a laser under the control of a computer. Subsequently, the silver halide layer is developed leaving a silver image on top of the photosensitive coating. That silver image then serves as a mask in an overall exposure of the photosensitive coating. After the overall exposure the silver image is removed and the photosensitive coating is developed. Such method is disclosed in for example JP-A-60-61 752 but has the disadvantage that a complex development and associated developing liquids are needed.

GB-1 492 070 discloses a method wherein a metal layer or a layer containing carbon black is provided on a photosensitive coating. This metal layer is then ablated by means of a laser so that an image mask on the photosensitive layer is obtained. The photosensitive layer is then overall exposed by UV-light through the image mask. After removal of the image mask, the photosensitive layer is developed to obtain a printing plate. This method however still has the disadvantage that the image mask has to be removed prior to development of the photosensitive layer by a cumbersome processing.

Furthermore methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of sensitivity in view of the storage stability and they show a lower resolution. The trend towards heat mode printing plate precursors is clearly seen on the market.

For example, Research Disclosure no. 33303 of January 1992 discloses a heat mode imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink-acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

U.S. Pat. No. 4,708,925 discloses imaging elements including a photosensitive composition comprising an alkali-soluble novolac resin and an onium-salt. This composition may optionally contain an IR-sensitizer. After image-wise exposing said imaging element to UV—visible—or IR-radiation followed by a development step with an aqueous alkali liquid there is obtained a positive or negative working printing plate. The printing results of a lithographic plate obtained by irradiating and developing said imaging element are poor. No baking step is mentioned.

EP-A-625 728 discloses an imaging element comprising a layer which is sensitive to UV- and IR-irradiation and which may be positive or negative working. This layer comprises a resole resin, a novolac resin, a latent Bronsted acid and an IR-absorbing substance. The printing results of a lithographic plate obtained by irradiating and developing said imaging element are poor. No characteristics of a baking gum are disclosed.

U.S. Pat. No. 5,340,699 is almost identical with EP-A-625 728 but discloses the method for obtaining a negative working IR-laser recording imaging element. The IR-sensitive layer comprises a resole resin, a novolac resin, a latent Bronsted acid and an IR-absorbing substance. The printing results of a lithographic plate obtained by irradiating and developing said imaging element are poor. No characteristics of a baking gum are disclosed.

Furthermore EP-A-678 380 discloses a method wherein a protective layer is provided on a grained metal support underlying a laser-ablatable surface layer. Upon image-wise exposure the surface layer is fully ablated as well as some parts of the protective layer. The printing plate is then treated with a cleaning solution to remove the residu of the protective layer and thereby exposing the hydrophilic surface layer. No baking step is disclosed.

EP-A-97 200 588.8 discloses a heat mode imaging element for making lithographic printing plates comprising on a lithographic base having a hydrophilic surface an intermediate layer comprising a polymer, soluble in an aqueous alkaline solution and a top layer that is sensitive to IR-radiation wherein said top layer upon exposure to IR-radiation has a decreased or increased capacity for being penetrated and/or solubilised by an aqueous alkaline solution.

EP-A-97 203 129.8 and EP-A-97 203 132.2 disclose a heat mode imaging element consisting of a lithographic base with a hydrophilic surface and a top layer which top layer is sensitive to IR-radiation, comprises a polymer, soluble in an aqueous alkaline solution and is unpenetratable for an alkaline developer containing $SiO_2$ as silicates. EP-A-98 201 215.5 and EP-A-98 201 213.0 discloses that the difference in solubility with said plates is increased by use of siloxane surfactants. Normally, after the developing step, the plate is rinsed with water and then treated with a gumming solution in order to protect the grained and anodized aluminum surface against chemical (oxidation) and mechanical (scratches) failures. In order to obtain a high number of copies such a plate is treated with a baking gum and a baking step (a static treatment during 5 minutes at 235° C. or a dynamic treatment during 2 minutes at 270° C.), thereby crosslinking the image areas and improving the adhesion of the image areas to the grained and anodized aluminum surface. However in this case there arises a problem of uncontrolled inhomogeneous ink acceptance, that is especially visible by the upstart and the restart of the printing process. No characteristics of a baking gum are disclosed.

OBJECTS OF THE INVENTION

It is an object of the present invention to provide a method for making a lithographic printing plate with a controlled homogeneous ink acceptance.

It is a further object of the present invention to provide a method for making a lithographic printing plate with a homogeneous ink acceptance at the upstart and restart of the printing process.

Still further objects of the present invention will become clear from the description hereinafter.

SUMMARY OF THE INVENTION

According to the present invention there is provided a method for the preparation of a lithographic printing plate comprising the steps of exposing with IR light an imaging element comprising on a lithographic base with a hydrophilic surface a first layer including a polymer, soluble in an aqueous alkaline solution and a top layer on the same side of the lithographic base as the first layer which top layer is IR-sensitive and unpenetratable for or insoluble in an alkaline developer wherein said first layer and said top layer may be one and the same layer, said imaging element comprising a siloxane surfactant;

developing said exposed imaging element with an alkaline solution;

gumming said developed imaging element with a baking gum solution;

subjecting said gummed imaging element to a thermal treatment at a temperature above 50° C.;

characterized in that said baking gum solution contains at least one surfactant making the contact angle between the baking gum solution and the surface of the plate less than 68° and/or at least one viscosity-regulating polymer making the viscosity of the baking gum solution between 1.7 cP and 5.0 cP.

DETAILED DESCRIPTION OF THE INVENTION

Baking gum solution or baking gumming solutions can be aqueous solutions of sodium dodecyl phenoxy benzene disulphonate, alkylated naphthalene sulphonic acid, sulphonated alkyl diphenyl oxide, methylene dinaphthalene sulphonic acid, etc. Other gumming solutions contain a hydrophilic polymer component and an organic acid component. Still other baking gumming solutions contains the potassium salt of the hydroxyethylidene diphosphonic acid. Still other baking gumming solutions contain a sulphosuccinamate compound and phosphoric acid. Said acids or salts are preferably present in the aqueous gumming solution in a concentration of 1 to 20 weight %, more preferably 2 to 10 weight %.

The contact angle between the baking gum solution and the plate is lowered till below 68° by adding at least one surfactant preferably in a concentration of 0.1 till 10 g/l, more preferably in a concentration of 1 to 5 g/l. Preferred surfactants are non-ionic polyglycols and perfluorated aliphatic polyester acrylates.

The viscosity of the baking gum solution is brought at a value of 1.7 cP to 5 cP, more preferably 2 to 4.5 cP by adding at least one viscosity increasing compound. Preferred viscosity increasing compounds are hydrophilic polymer compounds, more preferably polyethylene oxides. Said polyethylene oxides have preferably a molecular weight between 100,000 and 10,000,000, more preferably between 500,000 and 5,000,000. They are preferably used in a concentration of 0.01 to 10 g/l, more preferably of 0.05 to 5 g/l.

The top layer of the imaging element is also called the second layer.

In a first embodiment the first layer and the top layer are different. In said embodiment there is provided a heat mode imaging element for making lithographic printing plates having on a lithographic base with a hydrophilic surface a first layer including a polymer, soluble in an aqueous alkaline solution and a top layer on the same side of the lithographic base as the first layer which top layer is sensitive to IR-radiation and which is unpenetratable for an alkaline developer.

The top layer, in accordance with the present invention comprises an IR-dye or pigment and a binder resin. A mixture of IR-dyes or pigments may be used, but it is preferred to use only one IR-dye or pigment. Preferably said IR-dyes are IR-cyanines dyes. Particularly useful IR-cyanine dyes are cyanines dyes with two indolenine groups.

Particularly useful IR-absorbing pigments are carbon black, metal carbides, borides, nitrides, carbonitrides, bronze-structured oxides and oxides structurally related to the bronze family but lacking the A component e.g. WO2.9. It is also possible to use conductive polymer dispersion such as polypyrrole or polyaniline-based conductive polymer dispersions. The lithographic performance and in particular the print endurance obtained depends on the heat-sensitivity of the imaging element. In this respect it has been found that carbon black yields very good and favorable results.

The IR-absorbing dyes or pigments are present preferably in an amount between 1 and 99 parts, more preferably between 50 and 95 parts by weight of the total amount of said IR-sensitive top layer.

The top layer may preferably comprise as binder a water insoluble polymer such as a cellulose ester, a copolymer of vinylidene chloride and acrylonitrile, poly(meth)acrylates, polyvinyl chloride, silicone resins, etc. Preferred as binder is nitrocellulose resin.

The total amount of the top layer preferably ranges from 0.03 to 10 g/m$^2$, more preferably from 0.05 to 2 g/m$^2$.

In the top layer a difference in the capacity of being penetrated and/or solubilised by the aqueous alkaline solution is generated upon image-wise exposure for an alkaline developer according to the invention.

In the present invention the said capacity is increased upon image-wise IR exposure to such degree that the imaged parts will be cleaned out during development without solubilising and/or damaging the non-imaged parts.

The development with the aqueous alkaline solution is preferably done within an interval of 5 to 120 seconds.

Between the top layer and the lithographic base the present invention comprises a first layer soluble in an aqueous alkaline developing solution with preferentially a pH between 7.5 and 14. Said layer is preferably contiguous to the top layer but other layers may be present between the top layer and the first layer. The alkali soluble binders used in this layer are preferably hydrophobic binders as used in conventional positive or negative working PS-plates e.g. novolac polymers, polymers containing hydroxystyrene units, carboxy substituted polymers etc. Typical examples of these polymers are described in DE-A-4 007 428, DE-A-4 027 301 and DE-A-4 445 820. The hydrophobic binder used in connection with the present invention is further characterised by insolubility in water and partial solubility/swellability in an alkaline solution and/or partial solubility in water when combined with a cosolvent.

Furthermore this aqueous alkali soluble layer is preferably a visible light- and UV-light desensitised layer. Said layer is preferably thermally hardenable. This preferably visible light- and UV-desensitised layer does not comprise photosensitive ingredients such as diazo compounds, photoacids, photoinitiators, quinone diazides, sensitisers etc. which absorb in the wavelength range of 250 nm to 650 nm. In this way a daylight stable printing plate may be obtained.

Said first layer preferably also includes a low molecular acid, preferably a carboxylic acid, still more preferably a benzoic acid, most preferably 3,4,5-trimethoxybenzoic acid or a benzophenone.

The ratio between the total amount of low molecular acid or benzophenone and polymer in the first layer preferably ranges from 2:98 to 40:60, more preferably from 5:95 to 20:80. The total amount of said first layer preferably ranges from 0.1 to 10 g/m$^2$, more preferably from 0.3 to 2 g/m$^2$.

The first layer and/or the top (also called the second) layer comprises a siloxane surfactant. Other surfactants can be present. Said surfactants can be cationic, anionic or amphoteric surfactants, but are more preferably non-ionic surfactants. The surfactant is most preferably selected from the group consisting of perfluoroalkyl surfactants and alkylphenyl surfactants. The surfactant is preferably present in the top layer. The amount of surfactant lies preferably in the range from 0.001 to 0.3 g/m$^2$, more preferably in the range from 0.003 to 0.050 g/m$^2$.

In the imaging element according to the present invention, the lithographic base may be an anodised aluminum for all embodiments. A particularly preferred lithographic base is an electrochemically grained and anodised aluminum support. The anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another mode in connection with the present invention, the lithographic base having a hydrophilic surface comprises a flexible support, such as e.g. paper or plastic film, provided with a cross-linked hydrophilic layer for all embodiments. A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers or mixtures thereof such as for example, gelatin, polyvinyl pyrrolidone, starch or modified starch, xanthane gum, carboxymethyl cellulose or modified carboxymethyl cellulose, homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, more preferably between 0.5 and 5 parts by weight, most preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica may be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 μm and is preferably 1 to 10 μm.

Particular examples of suitable cross-linked hydrophilic layers for use in accordance with the present invention are disclosed in EP-A-601 240, GB-P-1 419 512, FR-P-2 300 354, U.S. Pat. Nos. 3,971,660, 4,284,705 and EP-A-514 490.

As flexible support of a lithographic base in connection with the present embodiment it is particularly preferred to use a plastic film e.g. substrated polyethylene terephthalate film, substrated polyethylene naphthalate film, cellulose acetate film, polystyrene film, polycarbonate film etc . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably at least 500 $m^2$ per gram.

In a second embodiment the first layer and the second layer are the same. In said embodiment there is provided a heat mode imaging element for making lithographic printing plates having on a lithographic base with a hydrophilic surface a top layer which top layer is sensitive to IR-radiation, comprises a polymer, soluble in an aqueous alkaline solution and is unpenetratable for or insoluble in an alkaline developer.

The IR-sensitive layer, in accordance with the present invention comprises an IR-dye or pigment and a polymer, soluble in an aqueous alkaline solution. A mixture of IR-dyes or pigments may be used, but it is preferred to use only one IR-dye or pigment. Suitable IR-dyes and pigments are those mentioned above in the first embodiment of the present invention.

The IR-dyes or pigments are present preferably in an amount between 1 and 60 parts, more preferably between 3 and 50 parts by weight of the total amount of said IR-sensitive top layer.

The alkali soluble polymers used in this layer are preferably hydrophobic and ink accepting polymers as used in conventional positive or negative working PS-plates e.g. carboxy substituted polymers etc. More preferably is a phenolic resin such as a hydroxystyrene units containing polymer or a novolac polymer. Most preferred is a novolac polymer. Typical examples of these polymers are described in DE-A-4 007 428, DE-A-4 027 301 and DE-A-4 445 820. The hydrophobic polymer used in connection with the present invention is further characterised by insolubility in water and at least partial solubility/swellability in an alkaline solution and/or at least partial solubility in water when combined with a cosolvent.

Furthermore this IR-sensitive layer is preferably a visible light- and UV-light desensitised layer. Still further said layer is preferably thermally hardenable. This preferably visible light- and UV-light desensitised layer does not comprise photosensitive ingredients such as diazo compounds, photoacids, photoinitiators, quinone diazides, sensitisers etc. which absorb in the wavelength range of 250nm to 650nm. In this way a daylight stable printing plate may be obtained.

Said IR-sensitive layer preferably also includes a low molecular acid, more preferably a carboxylic acid, still more preferably a benzoic acid, most preferably 3,4,5-trimethoxybenzoic acid or a benzophenone, more preferably trihydroxybenzophenone.

The ratio between the total amount of low molecular acid or benzofenone and polymer in the IR-sensitive layer preferably ranges from 2:98 to 40:60, more preferably from 5:95 to 30:70. The total amount of said IR-sensitive layer preferably ranges from 0.01 to 10 g/$m^2$, more preferably from 0.03 to 2 g/$m^2$.

The top layer comprises a siloxane surfactant. Another surfactant can also be present. Said surfactant can be a cationic, an anionic or an amphoteric surfactant, but is more preferably a non-ionic surfactant. The surfactant is most preferably selected from the group consisting of perfluoroalkyl surfactants and alkylphenyl surfactants. The amount of surfactant lies preferably in the range from 0.001 to 0.3g/$m^2$, more preferably in the range from 0.003 to 0.050g/$m^2$.

In the IR-sensitive layer a difference in the capacity of being penetrated and/or solubilised by the alkaline developer is generated upon image-wise exposure for an alkaline developer according to the invention.

To prepare a lithographic plate, the heat-mode imaging element is image-wise exposed and developed.

Image-wise exposure in connection with the present invention is an image-wise scanning exposure involving the use of a laser that operates in the infrared or near-infrared, i.e. wavelength range of 700–1500 nm. Most preferred are laser diodes emitting in the near-infrared. Exposure of the imaging element may be performed with lasers with a short as well as with lasers with a long pixel dwell time. Preferred are lasers with a pixel dwell time between 0.005 μs and 20 μs.

After the image-wise exposure the heat mode imaging element is developed by rinsing it with an aqueous alkaline solution. The aqueous alkaline solutions used in the present invention are those that are used for developing conventional positive working presensitised printing plates, preferably containing $SiO_2$ as silicates and having preferably a pH between 11.5 and 14. Thus the imaged parts of the top layer that were rendered more penetrable for the aqueous alkaline solution upon exposure are cleaned-out whereby a positive working printing plate is obtained.

In the present invention, the composition of the developer used is also very important.

Therefore, to perform development processing stably for a long time period particularly important are qualities such as strength of alkali and the concentration of silicates in the developer. Under such circumstances, the present inventors have found that a rapid high temperature processing can be performed, that the amount of the replenisher to be supplemented is low and that a stable development processing can be performed over a long time period of the order of not less than 3 months without exchanging the developer only when the developer having the foregoing composition is used.

The developers and replenishers for developer used in the invention are preferably aqueous solutions mainly composed of alkali metal silicates and alkali metal hydroxides represented by MOH or their oxyde, represented by $M_2O$, wherein said developer comprises $SiO_2$ and $M_2O$ in a molar ratio of 0.5 to 1.5 and a concentration of $SiO_2$ of 0.5 to 5% by weight. As such alkali metal silicates, preferably used are, for instance, sodium silicate, potassium silicate, lithium silicate and sodium metasilicate. On the other hand, as such alkali metal hydroxides, preferred are sodium hydroxide, potassium hydroxide and lithium hydroxide.

The developers used in the invention may simultaneously contain other alkaline agents. Examples of such other alkaline agents include such inorganic alkaline agents as ammonium hydroxide, sodium tertiary phosphate, sodium secondary phosphate, potassium tertiary phosphate, potassium secondary phosphate, ammonium tertiary phosphate, ammonium secondary phosphate, sodium bicarbonate, sodium carbonate, potassium carbonate and ammonium carbonate; and such organic alkaline agents as mono-, di- or triethanolamine, mono-, di- or trimethylamine, mono-, di- or triethylamine, mono- or di-isopropylamine, n-butylamine, mono-, di- or triisopropanolamine, ethyleneimine, ethylenediimine and tetramethylammonium hydroxide.

In the present invention, particularly important is the molar ratio in the developer of $[SiO_2]/[M_2O]$, which is generally 0.6 to 1.5, preferably 0.7 to 1.3. This is because if the molar ratio is less than 0.6, great scattering of activity is observed, while if it exceeds 1.5, it becomes difficult to perform rapid development and the dissolving out or removal of the light-sensitive layer on non-image areas is liable to be incomplete. In addition, the concentration of $SiO_2$ in the developer and replenisher preferably ranges from 1 to 4% by weight. Such limitation of the concentration of $SiO_2$ makes it possible to stably provide lithographic printing plates having good finishing qualities even when a large amount of plates according to the invention are processed for a long time period.

In a particular preferred embodiment, an aqueous solution of an alkali metal silicate having a molar ratio $[SiO_2]/[M_2O]$, which ranges from 1.0 to 1.5 and a concentration of $SiO_2$ of 1 to 4% by weight is used as a developer. In such case, it is a matter of course that a replenisher having alkali strength equal to or more than that of the developer is employed. In order to decrease the amount of the replenisher to be supplied, it is advantageous that a molar ratio, $[SiO_2]/[M_2O]$, of the replenisher is equal to or smaller than that of the developer, or that a concentration of $SiO_2$ is high if the molar ratio of the developer is equal to that of the replenisher.

In the developers and the replenishers used in the invention, it is possible to simultaneously use organic solvents having solubility in water at 20° C. of not more than 10% by weight according to need. Examples of such organic solvents are such carboxylic acid esters as ethyl acetate, propyl acetate, butyl acetate, amyl acetate, benzyl acetate, ethylene glycol monobutyl acetate, butyl lactate and butyl levulinate; such ketones as ethyl butyl ketone, methyl isobutyl ketone and cyclohexanone; such alcohols as ethylene glycol monobutyl ether, ethylene glycol benzyl ether, ethylene glycol monophenyl ether, benzyl alcohol, methylphenylcarbinol, n-amyl alcohol and methylamyl alcohol; such alkyl-substituted aromatic hydrocarbons as xylene; and such halogenated hydrocarbons as methylene dichloride and monochlorobenzene. These organic solvents may be used alone or in combination. Particularly preferred is benzyl alcohol in the invention. These organic solvents are added to the developer or replenisher therefor generally in an amount of not more than 5% by weight and preferably not more than 4% by weight.

The developers and replenishers used in the present invention may simultaneously contain a surfactant for the purpose of improving developing properties thereof. Examples of such surfactants include salts of higher alcohol ($C_8$~$C_{22}$) sulfuric acid esters such as sodium salt of lauryl alcohol sulfate, sodium salt of octyl alcohol sulfate, ammonium salt of lauryl alcohol sulfate, Teepol B-81 (trade mark, available from Shell Chemicals Co., Ltd.) and disodium alkyl sulfates; salts of aliphatic alcohol phosphoric acid esters such as sodium salt of cetyl alcohol phosphate; alkyl aryl sulfonic acid salts such as sodium salt of dodecylbenzene sulfonate, sodium salt of isopropylnaphthalene sulfonate,sodium salt of dinaphthalene disulfonate and sodium salt of metanitrobenzene sulfonate; sulfonic acid salts of alkylamides such as $C_{17}H_{33}CON(CH_3)CH_2CH_2SO_3Na$ and sulfonic acid salts of dibasic aliphatic acid esters such as sodium dioctyl sulfosuccinate and sodium dihexyl sulfosuccinate. These surfactants may be used alone or in combination. Particularly preferred are sulfonic acid salts. These surfactants may be used in an amount of generally not more than 5% by weight and preferably not more than 3% by weight.

In order to enhance developing stability of the developers and replenishers used in the invention, the following compounds may simultaneously be used.

Examples of such compounds are neutral salts such as NaCl, KCl and KBr as disclosed in JN-A-58-75 152; chelating agents such as EDTA and NTA as disclosed in JN-A-58-190 952 (U.S. Pat. No. 4,469,776), complexes such as $[Co(NH_3)_6]Cl_3$ as disclosed in JN-A-59-121 336 (U.S. Pat. No. 4,606,995); ionizable compounds of elements of the group IIa, IIIa or IIIb of the Periodic Table such as those disclosed in JN-A-55-25 100; anionic or amphoteric surfactants such as sodium alkyl naphthalene sulfonate and N-tetradecyl-N,N-dihydroxythyl betaine as disclosed in JN-A-50-51 324; tetramethyldecyne diol as disclosed in U.S. Pat. No. 4,374,920; non-ionic surfactants as disclosed in JN-A-60-213 943; cationic polymers such as methyl chloride quaternary products of p-dimethylaminomethyl polystyrene as disclosed in JN-A-55-95 946; amphoteric polyelectrolytes such as copolymer of vinylbenzyl trimethylammonium chloride and sodium acrylate as disclosed in JN-A-56-142 528; reducing inorganic salts such as sodium sulfite as disclosed in JN-A-57-192 952 (U.S. Pat. No. 4,467,027) and alkaline-soluble mercapto compounds or thioether compounds such as thiosalicylic acid, cysteine and thioglycolic acid; inorganic lithium compounds such as lithium chloride as disclosed in JN-A-58-59 444; organic lithium compounds such as lithium benzoate as disclosed in JN-A-50 34 442; organometallic surfactants containing Si, Ti or the like as disclosed in JN-A-59-75 255; organoboron compounds as disclosed in JN-A-59-84 241 (U.S. Pat. No. 4,500,625); quaternary ammonium salts such as tetraalkylammonium oxides as disclosed in EP-A-101 010; and bactericides such as sodium dehydroacetate as disclosed in JN-A-63-226 657.

In the method for development processing of the present invention, any known means of supplementing a replenisher for developer may be employed. Examples of such methods preferably used are a method for intermittently or continuously supplementing a replenisher as a function of the amount of PS plates processed and time as disclosed in JN-A-55-115 039 (GB-A-2 046 931), a method comprising disposing a sensor for detecting the degree of light-sensitive layer dissolved out in the middle portion of a developing zone and supplementing the replenisher in proportion to the detected degree of the light-sensitive layer dissolved out as disclosed in JN-A-58-95 349 (U.S. Pat. No. 4,537,496); a method comprising determining the impedance value of a developer and processing the detected impedance value by a computer to perform supplementation of a replenisher as disclosed in GB-A-2 208 249.

After the development of an image-wise exposed imaging element with an aqueous alkaline solution, the plate is then preferably rinsed with water and treated with a baking gum solution. To improve durability said plate is baked at a temperature above 50° C., preferably above 100° C., more preferably between 200° C. and 300° C. for a period of at least 30 seconds, more preferably for a period between 1 and 10 minutes.

The following examples illustrate the present invention without limiting it thereto. All parts and percentages are by weight unless otherwise specified.

EXAMPLE 1

(Comparative Example)

Preparation of the Lithographic Base

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 350° C. and a current density of 1200 A/$m^2$ to form a surface topography with an average center-line roughness Ra of 0.5 $\mu$m.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 A/$m^2$ for about 300 seconds to form an anodic oxidation film of 3.00 g/$m^2$ of $Al_2O_3$ then washed with demineralized water, posttreated with a solution containing polyvinylphosphonic acid and subsequently with a solution containing aluminum trichloride, rinsed with demineralized water at 20° C. during 120 seconds and dried.

Preparation of the Heat-mode Imaging Element

On the above described lithographic base was first coated a layer from a 8.6% wt solution in tetrahydrofuran/methoxypropanol 55/45 ratio, with a wet coating thickness of 14 $\mu$m. The resulting layer contained 80% of ALNOVOL SPN452™ (sold by Clariant, Germany) and 20% of 3,4,5-trimethoxybenzoic acid. Upon this layer was coated with a wet coating thickness of 20 $\mu$m, the IR-sensitive layer from a 0.31% wt solution in methylethylketone/methoxypropanol 50/50 ratio. This layer was dried at a temperature of at least 120° C. for at least 80 seconds. The resulting IR-sensitive layer contained 30 mg/$m^2$ of IR-absorber I, 17.5 mg/$m^2$ of FLEXO-BLAU 630™, 2.0 mg/$m^2$ of TEGO WET 265™ and 5.0 mg/$m^2$ of TEGO GLIDE 410™ (both siloxanes surfactants from Goldschmitt, Germany). FLEXO-BLAU 630 is commercially available by BASF, Ludwigshafen, Germany.

IR-absorber I

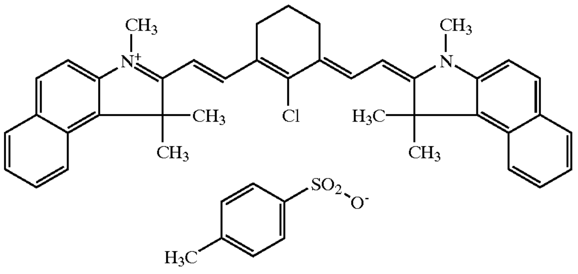

Exposing the Heat-mode Imaging Element

The material was imaged with a Creo 3244 Trendsetter™ external drum platesetter at 130 mJ/$cm^2$ and 2400 dpi.

Developing and Printing the Imagewise Exposed Element

The exposed material was developed in a Technigraph NPX-32™ processor filled with an aqueous alkaline positive developer EP 26™ (commercially available from Agfa) in the developer section, filled with water in the rinsing section and treated with Ozasol RC 515™ (commercially available from Agfa) baking gum solution in the gumming section. Processing speed was 1.0 m/min and developer temperature was 25° C. After processing the obtained plate was post-baked for 5 min at 235° C. to guarantee high run length. An uneven covering of baking gum on the image parts was detected.

Printing this material on a GTO 52 press™ equipped with a Dahlgren dampening system™, with Rotamatic fountain solution™ and K+E Skinnex Magenta Ink™, leads to problems of uneven ink-uptake, i.e. uncontrolled ink splitting from plate surface.

EXAMPLE 2

Preparation of the lithographic base, preparation of the heat-mode imaging element, exposing the heat-mode imaging material were carried out as described in example 1. Developing was carried out as described in example 1, except that a different baking gum solution was used in the gumming section Baking gum 1: RC 515. Contact angle 72°, viscosity 1.5 cP.

Baking gum 2: 1 l of RC 515 and 20 ml of a 5 w/w % solution of Akypo OP 80™ (trade name of a polyethyleneoxide surfactant from KAO, Germany). Contact angle 66°, viscosity 1.5 cP.

Baking gum 3: 1 l of RC 515 and 104 ml of a 5 w/w % solution of Antarox CO 630™ (trade name of a polyethylene oxide surfactant from Antara Chemie). Contact angle 66°, viscosity 1.5 cP.

Baking gum 4: 1 l of RC 515 and 0.78 g polyethylene oxide with a molecular weight of 2,000,000. Contact angle 71°, viscosity 3.5 cP.

Baking gum 5: 1.104 l of baking gum 3 and 0.70 g polyethylene oxide with a molecular weight of 2,000,000. Contact angle 66°, viscosity 2.8 cP.

Baking gum 6: 1.104 l of baking gum 3 and 0.25 g polyethylene oxide with a molecular weight of 2,000,000. Contact angle 66°, viscosity 2.15 cP.

The contact angle between the baking gum solution and above mentioned imaging element was determined by the classical traeted plate technique. However in our application, no tilting of the substrate was applied, the substrate remaining horizontal during the measurement. The contact angle, 30 s after dropping the baking gum solution onto the substrate is considered as the value in our measurements. Printing the imagewise exposed element was carried out as described in example 1. The results are given in table 1

| Baking gum | Spreading behaviour | Ink-uptake |
|---|---|---|
| RC 515 | uneven | uneven: 65%; even:.35% |
| Baking gum 2 | even | uneven: 33%; even: 66% |
| Baking gum 3 | even | uneven: 20%; even: 80% |
| Baking gum 4 | even | even: 100% |
| Baking gum 5 | even | even: 100% |
| Baking gum 6 | even | even: 100% |

From the results in table 1, it is clear that the baking gums according to the invention (baking gums 2 to 6) gives a good to an excellent spreading of the gum on the plate and ink-uptake.

What is claimed is:

1. A method for the preparation of a lithographic printing plate comprising exposing with IR light an imaging element comprising on a lithographic base with a hydrophilic surface a first layer including a polymer, soluble in an aqueous alkaline solution and a top layer on the same side of the lithographic base as the first layer which top layer is IR-sensitive and unpenetrable for or insoluble in an alkaline developer wherein said first layer and said top layer may be one and the same layer, said imaging element comprising a polysiloxane surfactant but not comprising a quinone diazide or a diazo compound;

developing said exposed imaging element with an alkaline solution;

gumming said developed imaging element with a baking gum solution;

subjecting said gummed imaging element to a thermal treatment at a temperature above 50° C.;

wherein said baking gum solution contains at least one surfactant making the contact angle between the baking gum solution and the surface of the plate less than 68° and/or at least one viscosity-regulating polymer making the viscosity of the baking gum solution between 1.7 cP and 5.0 cP.

2. A method according to claim 1 wherein said baking gum solution contains a non-ionic polyglycol or a perfluorated aliphatic polyester acrylate.

3. A method according to claim 1 wherein said baking gum solution contains a high molecular polyethylene oxide.

4. A method according to claim 1 wherein said top layer of said imaging element contains an IR dye or carbon black.

5. A method according to claim 1 wherein said first layer of said imaging element contains a novolac polymer.

6. A method according to claim 1 wherein said lithographic base with a hydrophilic surface of said imaging element is electrochemical grained and anodized aluminum.

7. A method according to claim 1 wherein said alkaline solution contains an alkali metal silicate.

8. A method for the preparation of a lithographic printing plate comprising exposing with IR light an imaging element comprising on a lithographic base with a hydrophilic surface a first layer including a polymer, soluble in an aqueous alkaline solution and a top layer on the same side of the lithographic base as the first layer which top layer is IR-sensitive and unpenetrable for or insoluble in an alkaline developer wherein said first layer and said top layer may be one and the same layer, said imaging element comprising a polysiloxane surfactant;

developing said exposed imaging element with an alkaline solution;

gumming said developed imaging element with a baking gum solution which contains a high molecular polyethelene oxide;

subjecting said gummed imaging element to a thermal treatment at a temperature above 50° C.;

wherein said baking gum solution further contains at least one surfactant making-the contact angle between the baking gum solution and the surface of the plate less than 68° and/or at least one viscosity-regulating polymer making the viscosity of the baking gum solution between 1.7 cP and 5.0 cP.

* * * * *

UNITED STATES PATENT AND TRADEMARK OFFICE

CERTIFICATE OF CORRECTION

PATENT NO. : 6,455,229 B1
DATED : September 24, 2002
INVENTOR(S) : Joan Vermeersch et al.

It is certified that error appears in the above-identified patent and that said Letters Patent is hereby corrected as shown below:

Column 11,
Line 31, "350°C." should read -- 35°C. --.

Column 14,
Line 37, "making-the" should read -- making the --.

Signed and Sealed this

Twenty-eighth Day of January, 2003

JAMES E. ROGAN
*Director of the United States Patent and Trademark Office*